(12) United States Patent
Zhang et al.

(10) Patent No.: US 8,576,568 B2
(45) Date of Patent: *Nov. 5, 2013

(54) ELECTRONIC DEVICE WITH SLIDING APPARATUS

(75) Inventors: Guang-Yi Zhang, Shenzhen (CN); Meng-Qi Zhang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 42 days.

This patent is subject to a terminal disclaimer.

(21) Appl. No.: 13/306,910

(22) Filed: Nov. 29, 2011

(65) Prior Publication Data

US 2013/0107450 A1 May 2, 2013

(30) Foreign Application Priority Data

Oct. 31, 2011 (CN) .......................... 2011 1 0337210

(51) Int. Cl.
*H05K 7/16* (2006.01)

(52) U.S. Cl.
USPC ........... 361/727; 211/26; 312/322; 312/334.1

(58) Field of Classification Search
USPC .......... 361/725, 727, 741, 756, 802; 312/119, 312/322, 334.1; 211/26
See application file for complete search history.

(56) References Cited

U.S. PATENT DOCUMENTS

| 4,258,967 | A * | 3/1981 | Boudreau | 312/322 |
| 7,633,760 | B2 * | 12/2009 | Wu et al. | 361/727 |
| 8,104,626 | B2 * | 1/2012 | Huang et al. | 211/26 |
| 2004/0020874 | A1 * | 2/2004 | Haney | 211/26 |
| 2009/0219701 | A1 * | 9/2009 | Wu et al. | 361/727 |

OTHER PUBLICATIONS

U.S. Appl. No. 13/298,304, filed Nov. 2011, Guang-Yi Zhang; Meng-Qi Zhang.*

* cited by examiner

*Primary Examiner* — Xiaoliang Chen
(74) *Attorney, Agent, or Firm* — Altis & Wispro Law Group, Inc.

(57) ABSTRACT

A sliding apparatus includes a sliding member fixed to a first end of a server module, an elongated sleeve shaped first slide rail, and an elongated pole shaped second slide rail. The sliding member includes a first holding portion and a second holding portion each defining a mounting hole. The second slide rail is slidably retained in the mounting holes of the first and second holding portions. A first end of the first slide rail is fixed to a rack. A latch member is fixed to the sliding member for latch the rack. A first end of the second slide rail is slidably received in a second end of the first slide rail. A second end of the second slide rail is fixed to a second end of the server module.

16 Claims, 6 Drawing Sheets

ELECTRONIC DEVICE WITH SLIDING APPARATUS

CROSS-REFERENCE TO RELATED APPLICATION

Relevant subject matter is disclosed in a pending U.S. patent application with application Ser. No. 13/298,304, filed on Nov. 17, 2011 and entitled "ELECTRONIC DEVICE WITH SLIDING APPARATUS", which is assigned to the same assignee as this patent application.

BACKGROUND

1. Technical Field

The present disclosure relates to electronic devices, and particularly, to an electronic device having sliding apparatus.

2. Description of Related Art

Electronic devices, such as servers, usually use sliding apparatus to move the server module into or out of the rack of the electronic device. The traditional sliding apparatus often occupy large space in the rack.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
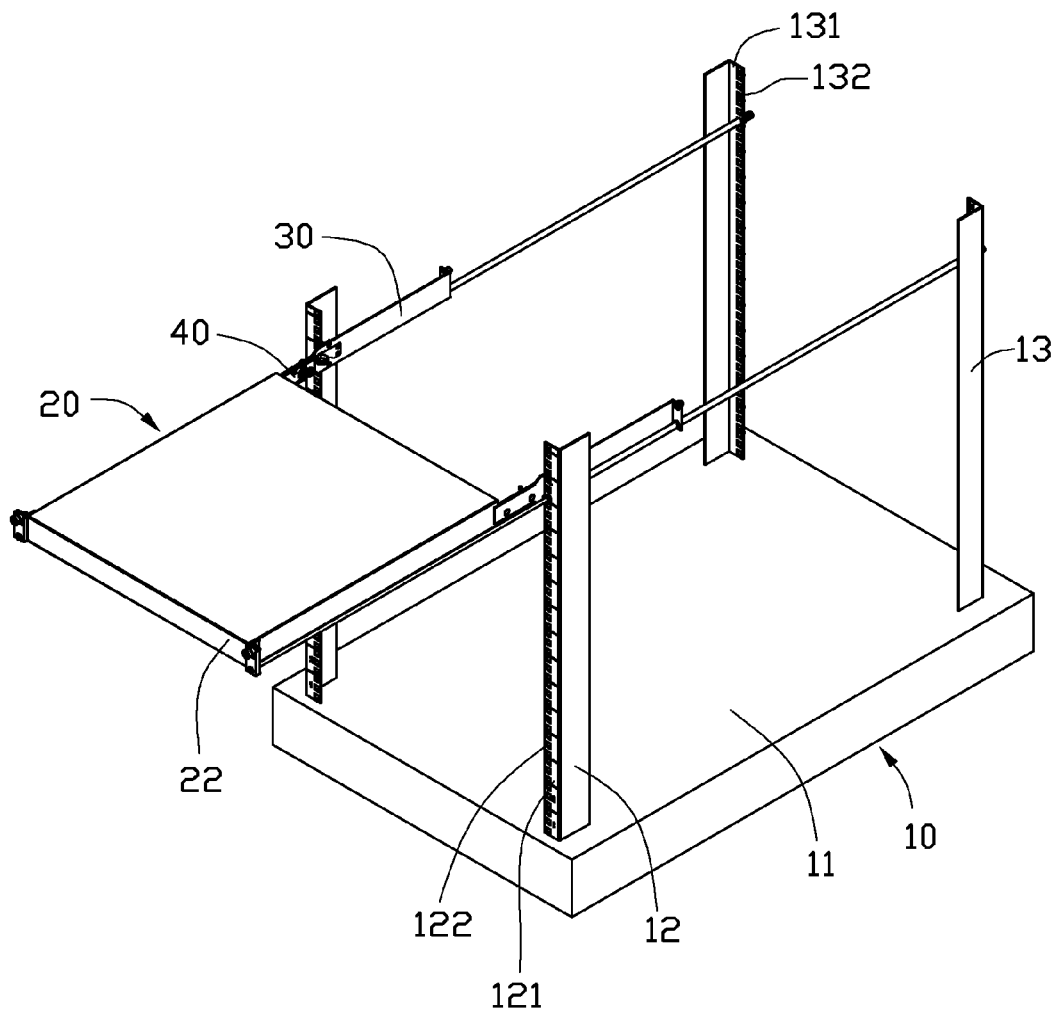
FIG. 1 is an assembled, isometric view of an electronic device, in accordance with an embodiment, wherein the electronic device includes a rack, a server module, two sliding apparatus, two locking apparatus, and two latch members.
Figure 4:
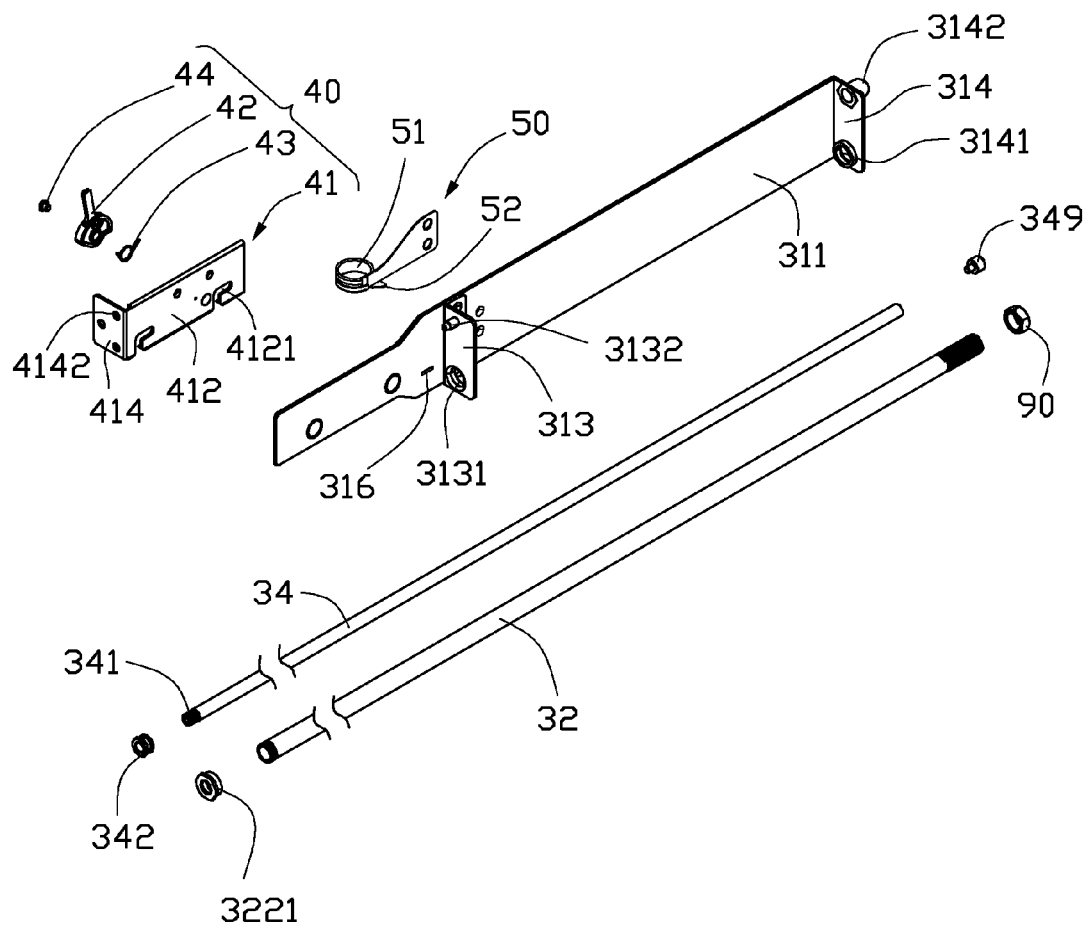
FIG. 4 and FIG. 5 are exploded, isometric views of FIG. 3, but are viewed from different aspects.

Referring to FIG. 1, an exemplary embodiment of an electronic device includes a rack 10, a server module 20, two sliding apparatus 30, two locking apparatus 40, and two resilient latch members 50 (shown in FIG. 4).

Figure 2:
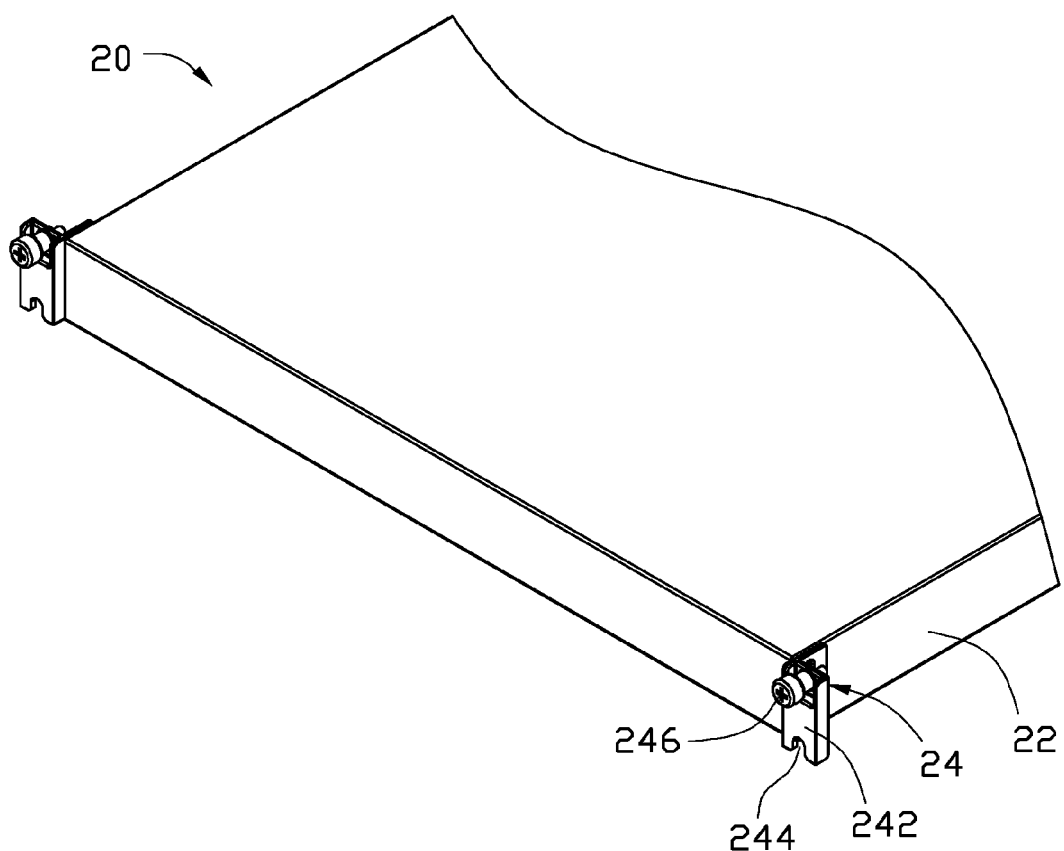
FIG. 2 is an assembled, enlarged view of the server module of FIG. 1.

Referring to FIG. 2, the server module 20 includes two opposite side surfaces 22 each fixed with an L-shaped mounting piece 24 at a front end. The mounting piece 24 includes a fixing portion 242 perpendicular to the corresponding side surface 22. A mounting slot 244 is defined in a lower portion of each fixing portion 242, extending through a bottom edge of the fixing portion 242. A thumbscrew 246 is movably attached to the fixing portion 242 above the mounting slot 244.

The rack 10 includes a base 11, two first posts 12 perpendicularly extending up from a front end of the base 11, and two second posts 13 perpendicularly extending up from a rear end of the base 11. The first and second posts 12 and 13 each have an L-shaped cross-section. The first posts 12 each include a flange 121 longitudinally defining a plurality of mounting holes 122. The second posts 13 each include a flange 131 facing the corresponding flange 121 and defining a plurality of mounting holes 132.

Figure 3:
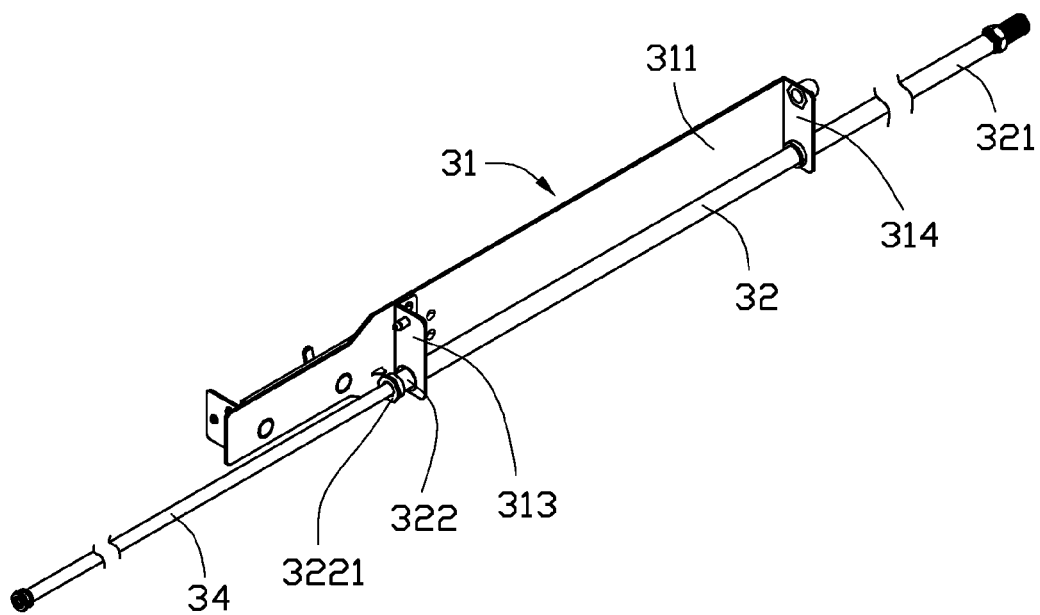
FIG. 3 is an assembled, enlarged view of one of the sliding apparatus, one of the locking apparatus, and one of the latch members of FIG. 1.
Figure 5:
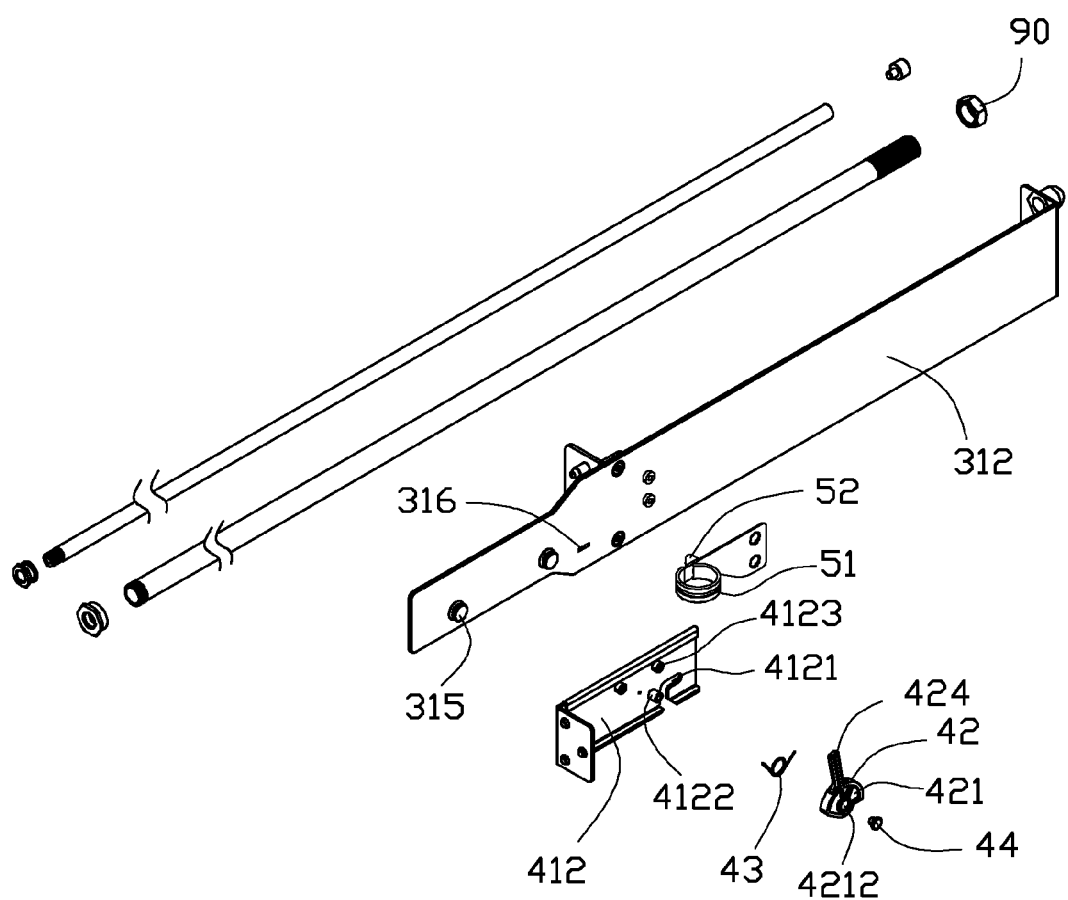

Referring to FIGS. 3 to 5, each sliding apparatus 30 includes a sliding member 31, an elongated and sleeve shaped first slide rail 32, and an elongated and pole shaped second slide rail 34 slidably received in the first slide rail 32.

A first holding portion 313 and a second holding portion 314 perpendicularly extend from a first side surface 311 of the sliding member 31. The first and second holding portions 313 and 314 are spaced from and parallel to each other. The first holding portion 313 defines a first mounting hole 3131. A first rod 3132 protrudes on the first holding portion 313 above the first mounting hole 3131, away from the second holding portion 314. The second holding portion 314 defines a second mounting hole 3141. A second rod 3142 protrudes on the second holding portion 314 above the second mounting hole 3141, away from the first holding portion 313. Two mushroom shaped protrusions 315 protrude on a second side surface 312 of the sliding member 31 opposite to the first side surface 311.

The first and second holding portions 313 and 314, through the first slide rail 32 extending through the first mounting hole 3131 and the second mounting hole 3141, retaining the first slide rail 32. A first end 321 of the first slide rail 32 is extended out of the second holding portion 314 opposite to the first holding portion 313, and forms a threaded portion. A screw nut 3221 is detachably fitted about a second end 322 of the first slide rail 32. A first end of the second slide rail 34 is slidably received in the corresponding first slide rail 32 from the second end 322. The first end of the second slide rail 34 fixes a block 349 to be blocked by the screw nut 3221 to avoid releasing from the first slide rail 32. A threaded portion 341 is formed on a second end of each second slide rail 34 opposite to the first slide rail 32. A screw 342 can be screwed on the threaded portion 341.

Each latch member 50 is fixed to the second side surface 312 adjacent to the first holding portion 313 with a first end. A ring shaped operation portion 51 extends from a second end of the latch member 50. A wedge 52 protrudes on the latch member 50 adjacent to the operation portion 51. The sliding member 31 defines a through hole 316 for the wedge 52 to extend through.

Each locking apparatus 40 includes an L-shaped fixing member 41, a releasing member 42, a resilient member 43, and a fastener 44. The fixing member 41 includes a locking plate 412 and a fixing plate 414 extending perpendicularly from an end of the locking plate 412. The fixing plate 414 defines a plurality of fixing holes 4142. Two substantially L-shaped locking slots 4121 are defined in a bottom side of the locking plate 412. A pivot pin 4122 protrudes on the locking plate 412 adjacent to one of the locking slot 4121. Two spaced positioning pins 4123 protrude on the locking plate 412 above the pivot pin 4122. The releasing member 42 includes a fan shaped main body 421, which can block an inlet of one of the locking slots 4121. A pivot hole 4212 is defined in the main body 421. A handle 424 extends from a circumference of the main body 421 away from the pivot hole 4212. The pivot hole 4212 is pivotably set around the pivot pin 4122. The fastener 44 screws into the pivot pin 4122 to block the releasing member 42. The handle 424 is positioned between the positioning pins 4123. The resilient member 43 is set around the pivot pin 4122, and between the releasing member 42 and the locking plate 412, for biasing the releasing member 42. Two opposite ends of the resilient member 43 respectively abut against the releasing member 42 and the locking plate 412.

Referring to FIGS. 1 and 5, in assembling the server module 20 to the rack 10, mounting one side surface 22 to the rack 10 is described as an example. The first end 321 extends through one of the mounting holes 132 of a corresponding second post 13. A screw 90 is screwed to the first end 321. The sliding member 31 slides toward the corresponding first post 12 along the first slide rail 32, until the first rod 3132 engages in a corresponding mounting hole 122 of the first post 12 to position the sliding member 31. The wedge 52 abuts against the flange 121 to deform the latch member 50, until the wedge 52 slides over the flange 121. The latch member 50 is then restored to make the wedge 52 abut against an outer side of the flange 121 away from the second post 13, for preventing the sliding member 31 from moving back.

The second end of the second slide rail 34 extends through the mounting holes 122 below the first rod 3132. The screw 342 is screwed to the screw portion 341. The screw 342 is engaged in the mounting slot 244. The fixing plate 414 is fixed to a rear end of a corresponding side surface of the server module 20. The protrusions 315 are respectively engaged in the locking slots 4121. The resilient member 43 resists the releasing member 42 to block one of the protrusions 315 adjacent to the releasing member 42 in the corresponding locking slot 4121.

Figure 6:
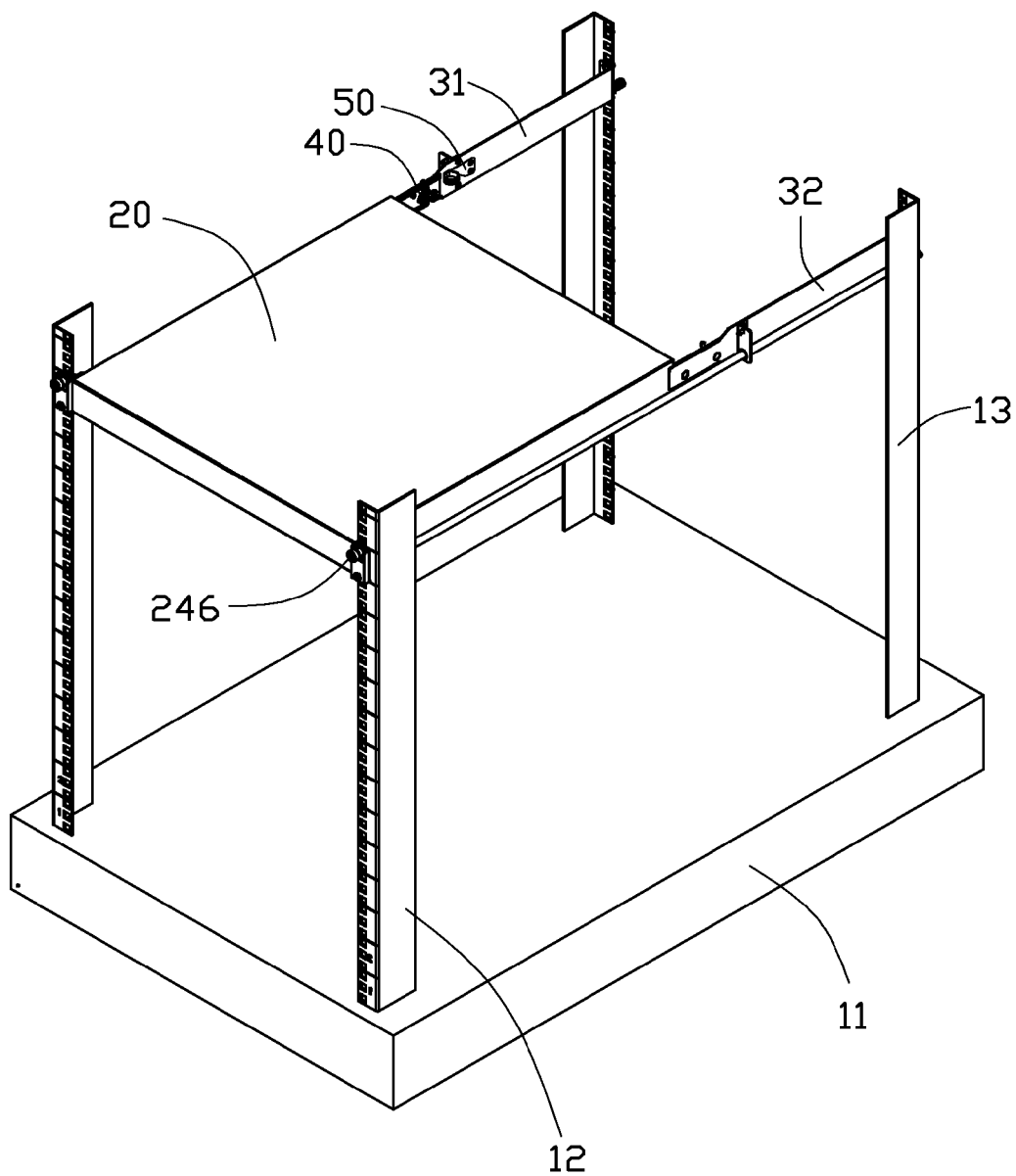
FIG. 6 shows another state of use of the sliding apparatus of FIG. 1.

Referring to FIG. 6, the operation portion 51 is operated to deform the latch member 50 away from the sliding member 31 until the wedge 52 is released from the flange 121. The server module 20 is pushed into the rack 10, the second slide rails 34 slide into the first slide rails 32. The second rods 3142 engage in the corresponding mounting holes 132. The thumbscrew 246 is screwed into one of the mounting holes 122.

In this embodiment, the sliding apparatus 30 includes a plurality of sleeve shaped first slide rails 32 and pole shaped second slide rails 34 slidably received in the first slide rails 32 respectively, which can save space on the rack 10.

In an alternative embodiment, the rear end of the server module 20 can be fixed to the second side surface 312 directly. Thereby, the locking apparatus 40 may be canceled.

It is believed that the present embodiments and theirs advantages will be understood from the foregoing description, and they will be apparent that various changes may be made thereto without departing from the spirit and scope of the description or sacrificing all of their material advantages, the examples hereinbefore described merely being exemplary embodiment.

What is claimed is:

1. A sliding apparatus to be connected between a rack and a server module, the sliding apparatus comprising:
    a sliding member to be fixed to a first end of the server module, wherein the sliding member comprises a first side surface and a second side surface opposite to the first side surface, and a first holding portion and a second holding portion each defining a mounting hole, the first holding portion and the second holding portion protrude from the first side surface, and the second side surface is fixed to the server module;
    an elongated and sleeve shaped first slide rail slidably retained in the mounting holes of the first holding portion and the second holding portion, wherein a first end of the first slide rail is fixed to the rack;
    an elongated and pole shaped second slide rail, wherein a first end of the second slide rail is slidably received in the first slide rail through a second end of the first slide rail, a second end of the second slide rail is fixed to a second end of the server module; and
    a latch member fixed to the sliding member and lockable to the rack.

2. The sliding apparatus of claim 1, wherein a screw nut is screwed to the second end of the first slide rail to block the second slide rail, to prevent the second slide rail from being released from the first slide rail.

3. The sliding apparatus of claim 1, wherein a first rod protrudes on the first holding portion for engaging in the rack.

4. The sliding apparatus of claim 1, wherein a second rod protrudes on the second holding portion for engaging in the rack.

5. The sliding apparatus of claim 1, wherein the latch member comprises an operation portion, and a wedge protruding on the latch member adjacent to the operation portion, the sliding member defines a through hole, the wedge extends through the through hole to abut against the rack.

6. An electronic device comprising:
    a rack;
    a server module comprising two side surfaces; and
    two sliding apparatus each arranged between a corresponding one of the two side surfaces and the rack; wherein each sliding apparatus comprises:
    a sliding member fixed to a first end of a corresponding one of the two side surfaces of the server module, wherein the sliding member comprises a first side surface and a second side surface opposite to the first side surface, and a first holding portion and a second holding portion each defining a mounting hole, the first holding portion and the second holding portion protrude from the first side surface, and the second side surface is fixed to the server module;
    an elongated and sleeve shaped first slide rail slidably retained in the mounting holes of the first holding portion and the second holding portion, wherein a first end of the first slide rail is fixed to the rack;
    an elongated and pole shaped second slide rail, wherein a first end of the second slide rail is slidably received in the first slide rail through a second end of the first slide rail, a second end of the second slide rail is fixed to a second end of the side surface of the server module; and
    a latch member fixed to the sliding member and lockable to the rack.

7. The electronic device of claim 6, wherein the rack comprises a base, two first posts extending up from a first end of the base, and two second posts extending up from a second end of the base, the first and second posts sandwich the server module, the first and second posts each define a plurality of mounting holes, the first end of the first slide rail is fixed to one of the first mounting holes of the corresponding first post, the second end of the second slide rail extends through one of the mounting holes of the corresponding second post to be fixed to the server module.

8. The electronic device of claim 7, wherein a first rod protrudes on the first holding portion for engaging in one of the mounting holes of the second post, a second rod protrudes on the second holding portion for engaging in one of the mounting holes of the first post.

9. The electronic device of claim 6, wherein a screw nut is screwed to the second end of the first slide rail to block the second slide rail, to prevent the second slide rail from being released from the first slide rail.

10. The electronic device of claim 6, wherein the latch member is fixed to the second side surface.

11. The electronic device of claim 6, wherein a mounting piece is fixed to the second end of each side surface of the server module, the mounting piece defines a mounting slot, the second end of the second slide rail is detachably engaged in the mounting slot.

12. The electronic device of claim 11, wherein a thumbscrew is movably attached to the mounting piece for screwing in the rack.

13. The electronic device of claim 6, further comprising a locking apparatus attached to the first end of the server module, wherein the locking apparatus is detachably attached to the sliding member.

14. The electronic device of claim 13, wherein the locking apparatus comprises a fixing member fixed to the server module, a releasing member pivotably attached to the fixing member, and a resilient member arranged between the releasing member and the fixing member.

15. The electronic device of claim 14, wherein a pin protrudes on the sliding member, a locking slot is defined in the fixing member, the pin pushes the releasing member to slide in the locking slot, the releasing member is biased by the resilient member to lock the pin in the locking slot.

16. The electronic device of claim 10, wherein the latch member comprises an operation portion, and a wedge protruding on the latch member adjacent to the operation portion, the sliding member defines a through hole, the wedge extends through the through hole to abut against the rack.

\* \* \* \* \*